United States Patent
Beaumont et al.

(10) Patent No.: US 10,181,399 B2
(45) Date of Patent: Jan. 15, 2019

(54) METHOD FOR MANUFACTURING A WAFER OF SEMICONDUCTING MATERIAL BASED ON A GROUP 13 ELEMENT NITRIDE

(71) Applicant: Saint-Gobain Lumilog, Courbevoie (FR)

(72) Inventors: Bernard Beaumont, Le Tignet (FR); Jean-Pierre Faurie, Valbonne (FR)

(73) Assignee: Saint-Gobain Lumilog (FR)

( * ) Notice: Subject to any disclaimer, the term of this patent is extended or adjusted under 35 U.S.C. 154(b) by 0 days.

(21) Appl. No.: 15/327,736

(22) PCT Filed: Jul. 27, 2015

(86) PCT No.: PCT/EP2015/067117
§ 371 (c)(1),
(2) Date: Jan. 20, 2017

(87) PCT Pub. No.: WO2016/016171
PCT Pub. Date: Feb. 4, 2016

(65) Prior Publication Data
US 2017/0213719 A1 Jul. 27, 2017

(30) Foreign Application Priority Data
Jul. 28, 2014 (FR) ...................................... 14 57268

(51) Int. Cl.
*H01L 21/00* (2006.01)
*H01L 21/02* (2006.01)
(Continued)

(52) U.S. Cl.
CPC ...... *H01L 21/0254* (2013.01); *H01L 21/0242* (2013.01); *H01L 21/0245* (2013.01);
(Continued)

(58) Field of Classification Search
CPC ..... H01L 21/02; H01L 21/00; H01L 21/0245; H01L 21/0254; H01L 21/0242;
(Continued)

(56) References Cited

U.S. PATENT DOCUMENTS 8,228,486 B2 * 7/2012 Kondo ................ G03F 7/70125
355/67
2013/0022773 A1 * 1/2013 Aida ........................ C30B 25/18
428/64.1

FOREIGN PATENT DOCUMENTS

| EP | 2544221 A1 | 1/2013 |
| EP | 2559791 A1 | 2/2013 |
| JP | 2009266874 A | 11/2009 |

OTHER PUBLICATIONS

International Search Report for Application No. PCT/EP2015/067117 dated Oct. 29, 2015.
(Continued)

*Primary Examiner* — Chuong A Luu
(74) *Attorney, Agent, or Firm* — Lerner, David, Littenberg, Krumholz & Mentlik, LLP

(57) ABSTRACT

A method for manufacturing a semi-conducting material including a layer of nitride of a group 13 element comprising active areas for manufacturing electronic components, and inactive areas, the active and inactive areas extending on a front face of the layer of nitride, the method comprising steps consisting of:
using a mask
comprising a plurality of apertures each defining an active area pattern on the initial substrate,
growing the layer of nitride,
receiving a theoretical pattern pitch corresponding to a desired distance between two adjacent active area patterns on the front face of the layer of nitride,
calculating at least one mask pitch different from the theoretical pattern pitch for compensating shifts in the
(Continued)

active area patterns, the mask pitch corresponding to a distance between two adjacent apertures of the protective mask.

11 Claims, 7 Drawing Sheets

(51) Int. Cl.
    *H01L 33/00*     (2010.01)
    *H01L 33/32*     (2010.01)

(52) U.S. Cl.
    CPC .. *H01L 21/02458* (2013.01); *H01L 21/02502* (2013.01); *H01L 21/02639* (2013.01); *H01L 33/0075* (2013.01); *H01L 33/32* (2013.01)

(58) Field of Classification Search
    CPC ......... H01L 21/02458; H01L 21/02639; H01L 21/02502; H01L 21/306; H01L 21/30612; H01L 21/02507
    USPC .......................................................... 257/76
    See application file for complete search history.

(56) References Cited

OTHER PUBLICATIONS

French Search Report for Application No. FR1457268 dated Mar. 17, 2015.

\* cited by examiner

METHOD FOR MANUFACTURING A WAFER OF SEMICONDUCTING MATERIAL BASED ON A GROUP 13 ELEMENT NITRIDE

CROSS REFERENCE TO RELATED APPLICATIONS

The present application is a national phase entry under 35 U.S.C. § 371 of International Application No. PCT/EP2015/067117, filed Jul. 27, 2015, published in French, which claims priority from French Patent Application No. 1457268, filed Jul. 28, 2014, the disclosures of which are hereby incorporated herein by reference.

TECHNICAL FIELD

The invention relates to the general technical field of the manufacturing of plates—or "wafers" according to the terminology of semi-conducting materials based on elements from columns 13 and 15 of the Periodic Table—such as gallium nitride.

Such a semi-conducting material may be intended for making semi-conducting structures such as light emitting diodes (LED) or laser diodes (LD).

PRESENTATION OF THE PRIOR ART

Semi-conducting materials based on nitrides of elements 13 of the Periodic Table occupy an increasingly important place in the fields of electronics and optoelectronics, notably for making semi-conducting components such as light-emitting diodes (LED) or laser diodes (LD).

Present methods for manufacturing wafers of a semi-conducting material based on a nitride of a group 13 element are based on the so-called hetero-epitaxy technique which consists of growing a crystal—such as a gallium nitride GaN crystal—on an initial substrate of a different nature—such as a sapphire substrate.

However, the hetero-epitaxy technique induces many crystalline defects in the structure of the group 13 element nitride, such as dislocations. These crystal defects limit performances and the lifetime of the components based on a group 13 element nitride.

In order to overcome this drawback, methods for manufacturing wafers of semi-conducting material are known, wherein the crystalline defects are concentrated in certain areas of the wafer.

Wafers including active areas are thereby obtained having a limited number of crystalline defects (dislocation density $TDD<5.10^8$ cm$^{-2}$, wherein "TDD" is the acronym "Threading Dislocation Density"), and inactive areas having a large number of crystal defects.

Such wafers including active areas and inactive areas are then used for manufacturing electronic components reproducing one (or several) more or less complex electronic functions. More specifically, each active area is used for producing one or several electronic components.

The active and inactive areas may have different shapes and generally extend on the wafer along a periodic pattern.

In order to facilitate the manufacturing of electronic components in the active areas, it is very important that the shape, the dimensions and the position of each active area on the wafer be known accurately.

A drawback of the existing methods for manufacturing wafers including active areas and inactive areas is the position, the shape and the dimensions of the active areas which may vary on a same wafer, but also from one wafer to another, which increases the difficulty in manufacturing electronic components on such wafers.

An object of the present invention is to propose a method for manufacturing semi-conducting material wafers including active areas with a low density of defects and inactive areas with a high density of defects wherein the position, the shape and the dimensions of the active areas are better controlled in order to meet the needs of manufacturers of electronic components using such wafers.

SUMMARY OF THE INVENTION

For this purpose, the invention proposes a method for manufacturing a semi-conducting material including a layer of a nitride of a group 13 element—such as gallium nitride—comprising active areas for manufacturing electronic components, and inactive areas, the active and inactive areas extending on a front face of the layer of nitride of a group 13 element, the concentration of crystalline defects in the active areas being less than the concentration of defects in the inactive areas, the method comprising the steps of:
  using a mask for forming an initial substrate:
    first regions for growing active areas and
    second regions for growing inactive areas,
  the protective mask comprising a plurality of apertures each defining an active area pattern on the initial substrate, and
  growing the layer of nitride of a group 13 element comprising the active and inactive areas on the first and second regions.

According to a first aspect of the invention, the method further comprises the following steps:
  receiving a theoretical pattern pitch, the theoretical pattern pitch corresponding to a desired distance between two active area patterns adjacent on the front face of the layer of nitride of a group 13 element,
  calculating at least one mask pitch different from the theoretical pattern pitch for compensating for the shifts of active area patterns, the shifts of active area patterns being due to the growth conditions of the semi-conducting material, the mask pitch corresponding to a distance between two adjacent apertures of the protective mask.

The active areas are used for creating electronic components. The inactive areas as for them are used as a buffer in order to concentrate the crystalline defects in order to improve the crystalline quality of the active areas.

According to another aspect of the invention—if necessary as an addition to the first—the protective mask used during the formation of the substrate has a protective mask pitch which is different from a theoretical pattern pitch provided beforehand,
said theoretical pattern pitch provided beforehand corresponding to a desired distance between two adjacent active area patterns on the front face of the layer of nitride of a group 13 element,
the pitch of the protective mask compensating for shifts in active area patterns due to the growth conditions of the semi-conducting material,
the obtained active area patterns being spaced apart by an actual pattern pitch corresponding to the theoretical pattern pitch to within an error margin.

As this will have been understood, the methods according to the first and/or second aspects of the invention have the advantage of allowing better control of the positions and of the dimensions of active areas on the front face of a layer of a nitride of a group 13 element. This gives the possibility of limiting the losses on each active area, and therefore improving the production yield of the electronic components in order to reduce their cost price.

Preferred but non-limiting aspects of the method according to the invention are the following:
- the pitch of the protective mask is estimated by calculation from the theoretical pattern pitch and from parameters related to the growth conditions of the semi-conducting material;
- the calculation of the protective mask pitch further takes into account a tolerance value ("DeltaMax") corresponding to the maximum error tolerated between the theoretical pattern pitch and the actual pattern pitch;
- the calculation parameters related to the growth conditions of the semi-conducting material include the following parameters:
  - a temperature variation between an initial temperature, such as a room temperature, and a temperature for growing the layer of nitride of a group 13 element,
  - the thermal expansion coefficient of the initial substrate and
  - the thermal expansion coefficient of the layer of nitride of a group 13 element;
- the step for calculating the mask pitch may comprise the resolution of the following equation:

$$p_0 = p_c \times \left(\frac{2\Delta_M}{\Phi} + 1\right) \times \frac{1}{1 + (TC - TA) \times (CTE^{substrate} - CTE^{material})}$$

wherein:
- $P_0$ is the mask pitch,
- $p_c$ is the theoretical pattern pitch,
- $\Delta_M$ is the tolerance value,
- $\Phi$ is the diameter of the initial substrate perpendicularly to the growth direction A-A',
- TC is the growth temperature of the material,
- TA is the room temperature,
- $CTE^{substrate}$ is the thermal expansion coefficient of the initial substrate,
- $CTE^{material}$ is the thermal expansion coefficient of the layer of nitride of a group 13 element;
- the protective mask pitch is estimated by a calculation from the radius of curvature of the initial deformed substrate at the end of the growth of the semi-conducting material;
- during the calculation step, a plurality of adapted mask pitches is estimated so as to obtain active area patterns spaced apart by an actual pattern pitch which is constant on the front face of the layer of nitride of a group 13 element;
- the step for calculating the mask pitch may comprise the resolution of the following equation:

$$p_0 = Pc - \tan\left(\frac{\phi}{2R}\right)(R \pm H) - \frac{\phi}{2} \quad (0)$$

wherein:
- $p_0$ is the mask pitch,
- $p_c$ is the theoretical pattern pitch,
- $\Phi$ is the diameter of the initial substrate,
- R is the radius of curvature of a growth face of the initial substrate,
- H is the distance between the front face and the rear face of the layer of nitride of a group 13 element;
- the method may further comprise a step for calculating first and second heights in the layer of nitride of a group 13 element, said first and second heights defining a thickness of the layer of nitride of a group 13 element in which the distance between the theoretical pattern pitch and the actual pattern pitch is less than the tolerance value;
- the method may also comprise a step for forming slices in the thickness of the layer of nitride of a group 13 element between the calculated first and second heights;
- the method may comprise a calculation step for the positions of the apertures of the protective mask on the initial substrate so as to compensate for the shifts of active area patterns over the whole surface of the front face of the layer of nitride of a group 13 element.

The invention also relates to a semi-conducting material, remarkable in that it may be obtained by the method described above, said material including a layer of nitride of a group 13 element including on its front face active and inactive areas, the active areas being spaced apart by an actual pattern pitch equal to a theoretical pattern pitch to within a tolerance value.

SHORT DESCRIPTION OF THE DRAWINGS

Other advantages and characteristics of the semi-conducting material and of its associated manufacturing method will further become apparent from the description which follows of several alternative embodiments, given as non-limiting examples, from the appended drawings wherein.

DETAILED DESCRIPTION

Figure 1A:
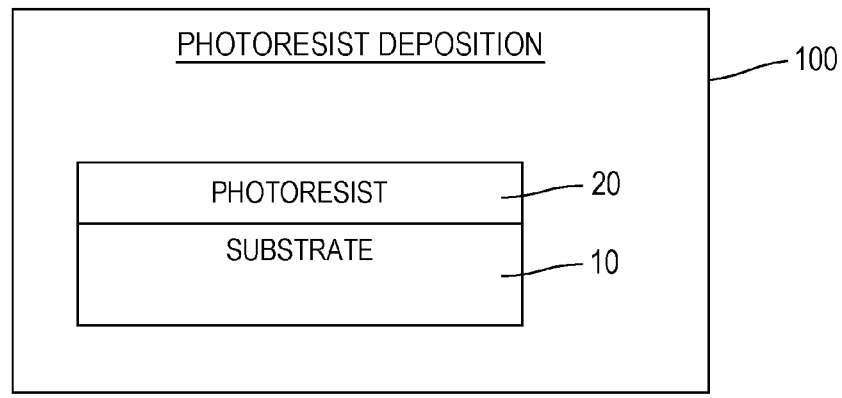
FIGS. 1a to 1g illustrate an embodiment of a method for manufacturing a semi-conducting material.

Various examples of manufacturing methods for a semi-conducting material will now be described in more detail, as well as for products obtained with reference to the figures. In these various figures, the equivalent elements bear the same numerical references.

1. General Elements Relating to the Method

With reference to FIGS. 1a to 1g, an embodiment of a method for manufacturing a semi-conducting material is illustrated, including a layer of nitride of a group 13 element, and more specifically of gallium nitride GaN. This semi-conducting material may be made on an initial substrate of the sapphire type.

More specifically, the method illustrated in FIGS. 1a to 1g allows manufacturing of a semi-conducting material comprising a layer of nitride of a group 13 element including active areas and adjacent inactive areas, the density of crystal defects being larger in the inactive areas than in the active areas.

By "adjacent areas" is meant within the scope of the present invention at least two areas positioned side by side and not stacked, i.e. positioned at a same level along a growth axis A-A' of the semi-conducting material, said areas being preferentially in contact with each other.

Moreover, it will be understood subsequently that when a layer A is mentioned as being "on"a layer B, the latter may be directly on the layer B, or may be located above the layer B and separated from said layer B by one or several inserted layers.

It will generally be understood that when a layer A is mentioned as being "on" a layer B, the latter may cover the whole surface of the layer B, or a portion of said layer B.

Within the scope of the present invention, by "areas of different crystalline orientations" are meant:
either two single crystal areas of different orientations,
or a single crystal area and a polycrystalline area,
or a single crystal area and an amorphous area.

The active and inactive areas have different crystalline orientations.

The active areas are of a single crystal and have a low density of crystal defects (for example a density of dislocations of less than or equal to about $1 \times 10^7$ dislocations/cm$^2$). They are intended to be used for producing electronic components. The surface of the active areas may be adjusted to that of a single electronic component or may be larger for receiving a multiplicity of these same components depending on the application.

The inactive areas are polycrystalline or amorphous and have a high density of crystal defects. The inactive areas give the possibility of concentrating dislocations forming in the layer of nitride of a group 13 element. They also give the possibility of absorbing stresses in the layer of nitride of a group 13 element, which tends to limit the risk of cracking of the latter.

The manufacturing method illustrated in FIGS. 1a to 1g globally comprises three phases:
a first phase (steps 100 to 600—FIGS. 1a to 1f) in which the initial substrate is treated for allowing the growing of a layer including adjacent areas with different crystallinities;
a second phase (step 700—FIG. 1g) in which a layer of nitride of a group 13 element is epitaxied.

The layer of nitride of a group 13 element may then be used for producing semi-conducting structures such as light-emitting diodes (LED), 1.1 First Phase of the Method With reference to FIG. 1a, the first phase of the method comprises a step 100 consisting of depositing a layer of photo-resist 20 on the growth face (a so-called "epitaxy-ready", or "epi-ready" face) of the sapphire substrate 10. Alternatively, the photo-resist layer may be replaced with a layer of dielectric material.

Figure 1B:
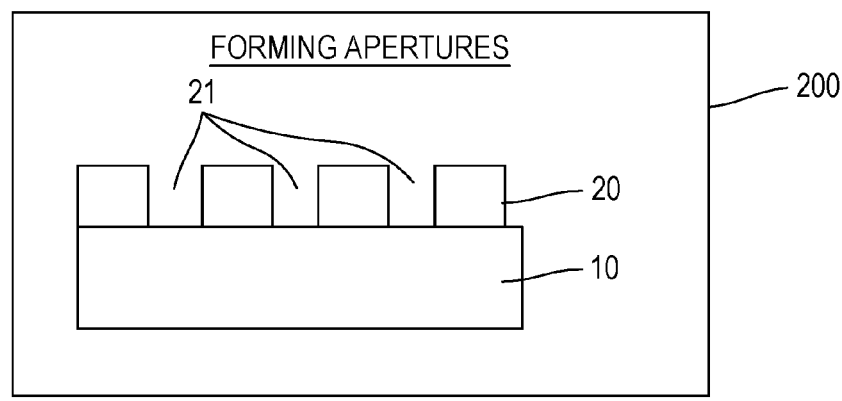

With reference to FIG. 1b, in another step 200 of the first phase, apertures 21 are formed in the photo-resist layer 20. The photo-resist layer is illuminated by using light emitting in the ultraviolet (UV) range. The exposure of the photo-resist layer 20 is applied through an exposure mask (not shown) in order to only illuminate certain regions of the photo-resist layer 20.

The apertures 21 form in the photo-resist layer 20 at the regions illuminated by the UV light, so that certain regions of the sapphire substrate 10 are no longer covered by the photo-resist layer 20.

A protective mask is thereby obtained, formed by the layer of photo-resist 20 comprising apertures 21 defining a geometrical pattern. The shape (point, square, triangle, strip, etc.), the dimensions and the distance between the apertures 21 of the protective mask depend on the targeted application. Notably:

the shape and the dimensions of the apertures are generally selected to be identical with one shape and with the desired dimensions of active areas,
the distance between the apertures is generally selected to be equal to a theoretical pattern pitch corresponding to the desired distance between two adjacent active areas.

Amorphous areas 11 are then created in the sapphire substrate 10 at the apertures 21 of the protective mask.

Figure 1C:
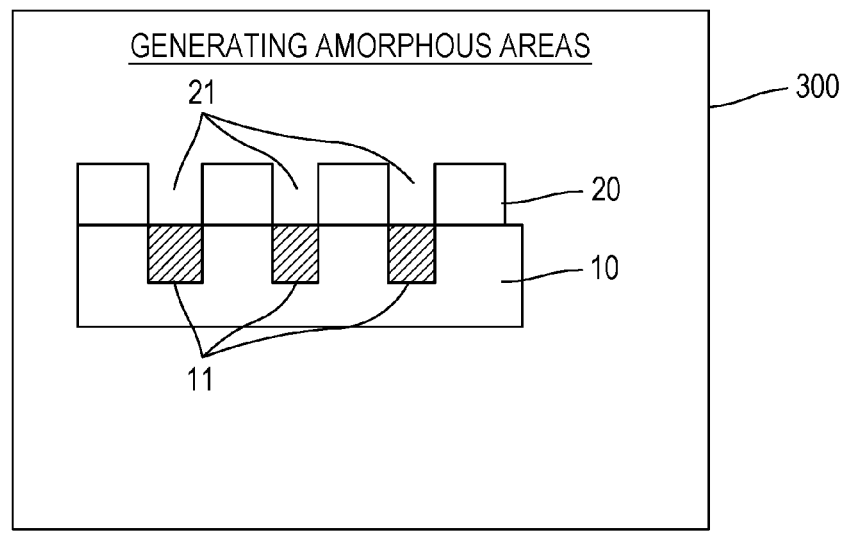

With reference to FIG. 1c, the substrate is exposed to a plasma of oxygen $O_2$ or to a plasma of argon Ar (step 300). The sapphire substrate 10 is subject to intense bombardment with ionized particles at the apertures 21 of the protective mask. This bombardment by a plasma destroys the crystallinity of the sapphire substrate 10 at the areas of its growth face not covered by the protective mask.

The crystalline areas of the substrate 10 located at right angles to the apertures 21 are converted into amorphous areas. The areas of the substrate covered by the protective mask are not damaged by the bombardment, so that they retain their crystalline nature. Exposure to bombardment by a plasma for a duration of the order of 2 to 5 minutes is sufficient for destroying the crystallinity of the sapphire substrate 10 at its surface.

Figure 1D:
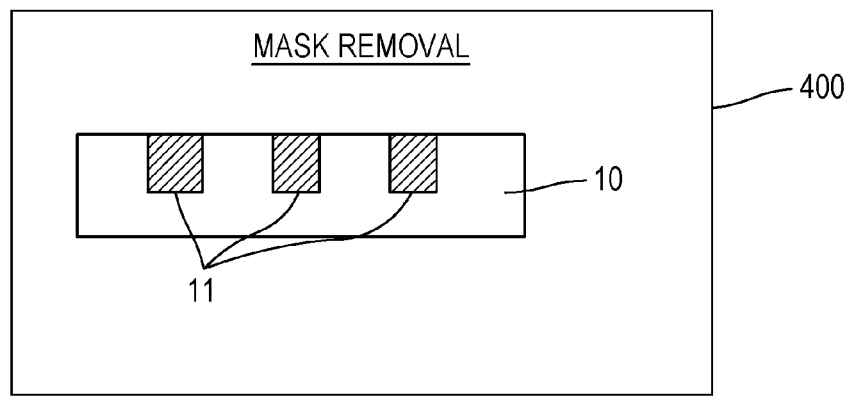

When the plasma bombardment step is completed, the protective mask is withdrawn (step 400) from the substrate, as in FIG. 1d. A sapphire substrate is then obtained comprising adjacent areas of different crystallinities in its growth plane.

Figure 1E:
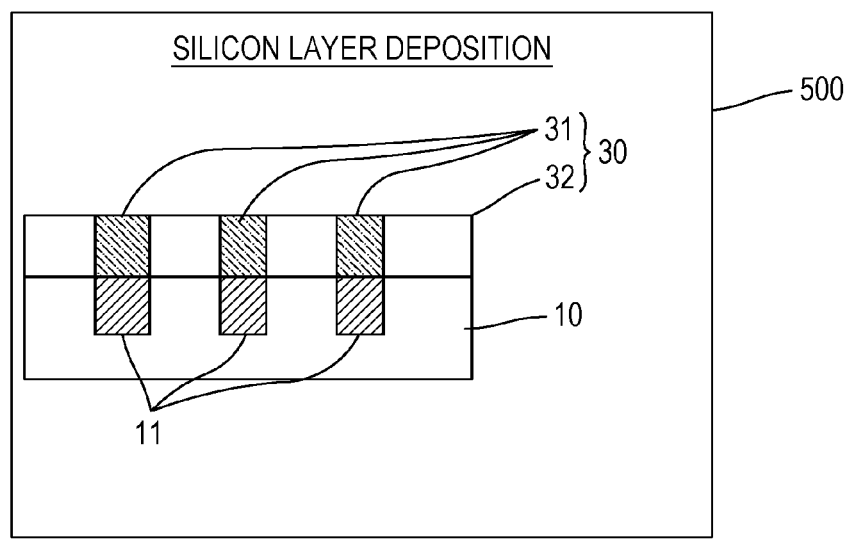

Optionally, a step 500 for depositing a silicon layer 30 on the treated substrate 10 is then applied, as illustrated in FIG. 1e. The silicon layer 30 is used as an intermediate layer intended to be spontaneously vaporized during the subsequent step for growth by epitaxy of the layer of nitride of a group 13 element, so as to obtain a self-supported layer of nitride of a group 13 element. Alternatively, this deposition step may not be applied, notably when the method is applied for manufacturing a bimetal, i.e. a semi-conducting material in which the layer of nitride of a group 13 element is secured to the initial substrate at the end of its manufacturing.

The growth of the silicon layer 30 on the substrate 10 including adjacent amorphous 11 and single crystal 12 areas induces the formation of a silicon layer 30 including adjacent amorphous 31 and crystalline 32 areas. Indeed, the inventors discovered that the crystallinity or the lack of crystallinity of the substrate propagates in the silicon layer 30 deposited on the latter. Thus, amorphous 31 or silicon areas close to the amorphous state (i.e. polycrystalline areas) form at the vertical of the amorphous areas 11 of the substrate 10, and single crystal silicon areas 32 form at the vertical of the single crystal areas 12 of the substrate 10.

Figure 1F:
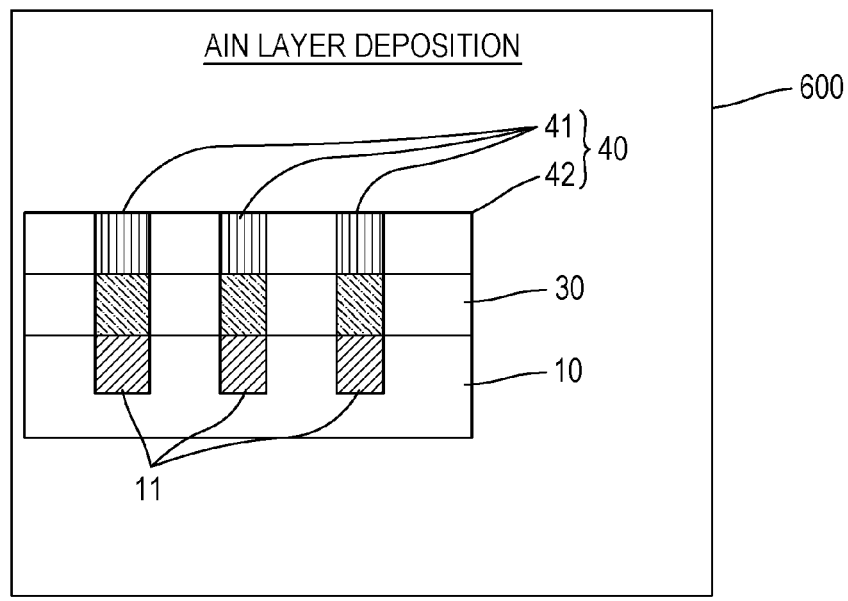

A layer of aluminium nitride AlN may also be deposited on the silicon layer 30 during step 600 (or on the substrate if the step for depositing the silicon layer is not applied), as illustrated by FIG. 1f. The aluminium nitride AlN layer is used as a buffer layer for improving the quality and the crystalline morphology of the gallium nitride GaN layer subsequently epitaxied. The epitaxy of the aluminium nitride layer 40 on the silicon layer 30 including adjacent amorphous 31 and single crystal 32 areas induces the formation of an aluminium nitride layer 40 including adjacent amorphous or polycrystalline areas 41 and single crystal areas 42. Indeed, the inventors have discovered that the crystallinity or lack of crystallinity propagates in the aluminium nitride layer 40. Thus, amorphous aluminium nitride areas 41—or close to the amorphous condition (i.e. polycrystalline)—form at right angles to the amorphous silicon areas 31, and single crystal aluminium nitride areas 42 form at right angles to the single crystal silicon areas 32.

The second phase of the method is then applied.

1.2 The Second Phase of the Method

Figure 1G:
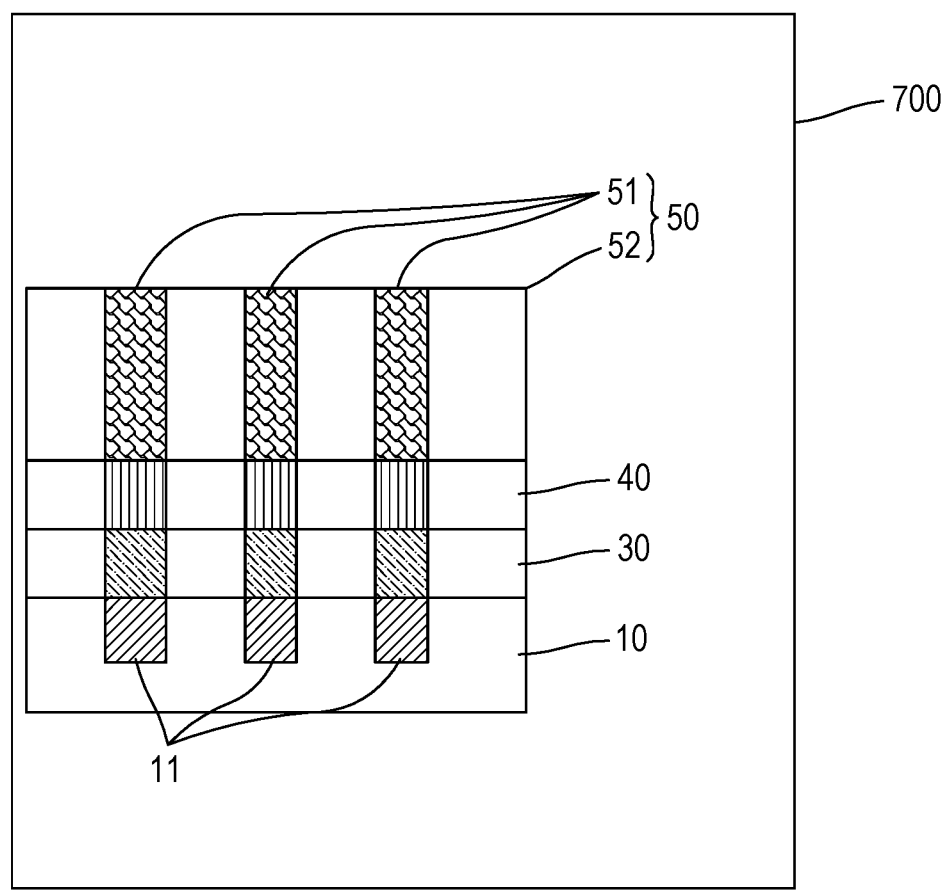

With reference to FIG. 1g, in a step 700 of the second phase, a layer of nitride of an element 13 is deposited on the aluminium nitride layer 40, such as a gallium nitride GaN layer 50. Deposition of the GaN layer 50 is achieved by epitaxy in the vapour phase from chlorides and hydrides (or HYPE, an acronym for "Hydride Vapour Phase Epitaxy"). However, one skilled in the art will appreciate that deposition of the GaN layer 50 may also be achieved by epitaxy in a vapour phase with organometallics (or MOVPE, acronym for "Metal Organic Vapour Phase Epitaxy").

Amorphous gallium nitride areas 51—or close to the amorphous condition (i.e. polycrystalline areas)—form at right angles to the amorphous aluminium nitride areas 41, and single crystal gallium nitride areas 52 form at right angles to the single crystal aluminium nitride areas 42.

During the growth of the gallium nitride layer, the silicon layer vaporizes spontaneously so that the AlN/GaN stack consisting of the layer of aluminium nitride AlN and of the layer of gallium nitride GaN detaches from the sapphire substrate. This decoupling between the sapphire substrate and the AlN/GaN stack favourably gives the possibility of limiting the cracking phenomenon in the gallium nitride layer by suppressing the stresses related to the differences of thermal coefficients between the sapphire and the gallium nitride during cooling after deposition of the gallium nitride layer 50.

Electronic components may then be made in the active areas of the layer of nitride of a group 13 element.

As indicated earlier, it is very important that the shape, the dimensions and the distance between each active area of the layer of nitride of a group 13 element be known accurately in order to allow the making of electronic components.

Now, the inventors discovered that the patterns of active and inactive areas shifted into the thickness of the layer of nitride of a group 13 element.

Figure 2:
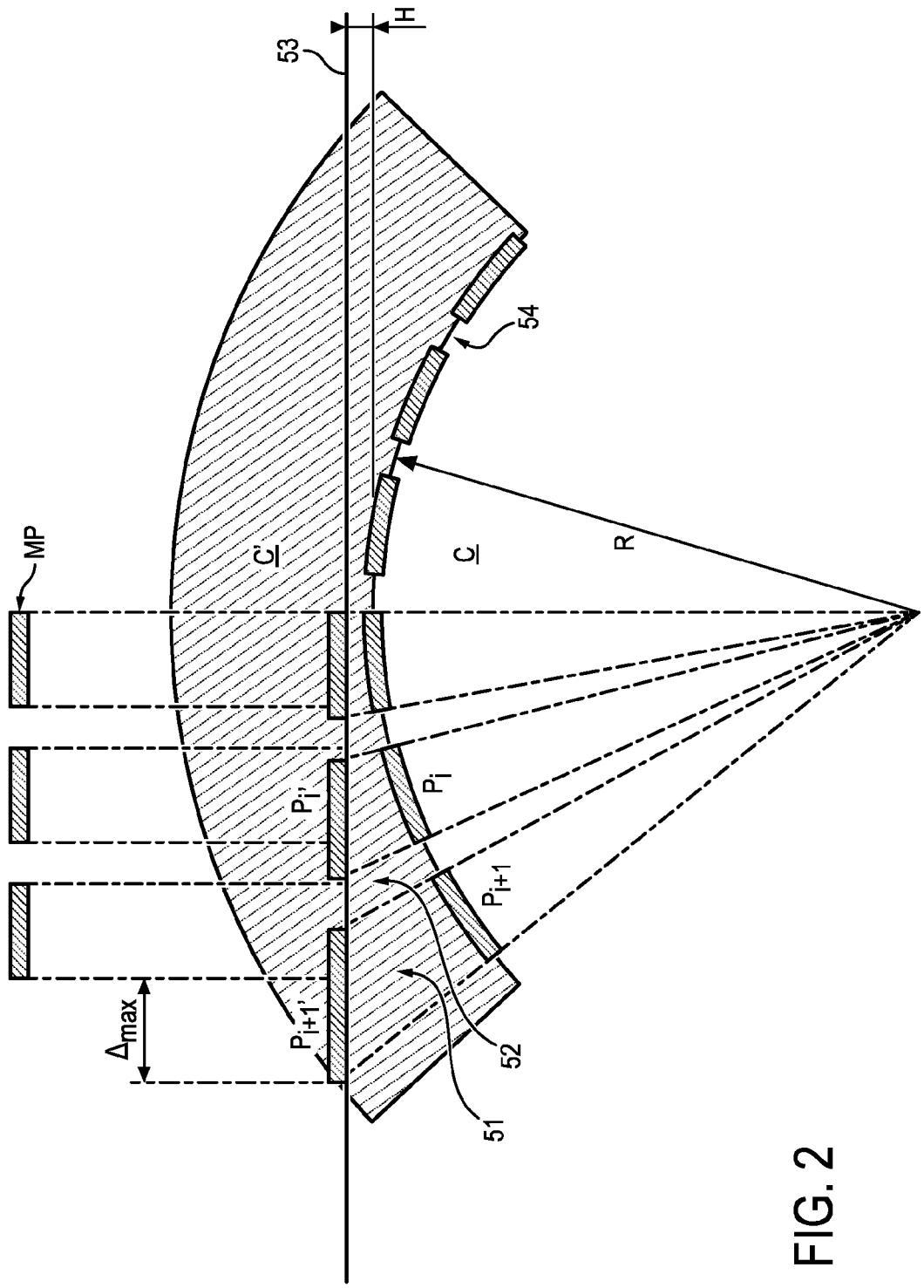
FIG. 2 illustrates the obtaining of active areas and of inactive areas in the case of a mask pattern with a pitch equal to the theoretical pattern pitch expected by the user.

FIG. 2 illustrates an exemplary layer 50 of nitride of a group 13 element with a mask pattern having a pitch P equal to the theoretically expected pattern pitch by the user. In this figure the pattern which results therefrom on the rear face 54 of the layer 50 (pitch $P_i$, $P_{i+i}$, etc. . . . wherein i is a silent index representing an integer) as well as the pattern which results therefrom on the front face 53 of said layer 50 (pitch $P'_i$, $P'_{i+i}$, etc. . . . ) are illustrated in this figure. References 51 and 52 respectively correspond to the inactive areas 51 and to the active areas 52.

A shift $\Delta_{max}$ on the pitches of the patterns between both surfaces 53 and 54 is observed.

This shift makes it very difficult to produce electronic components on the whole surface of the layer of nitride of a group 13 element, which reduces the production yield of such electronic components and therefore increases their price cost. The inventors have studied phenomena producing such a shift in the active and inactive areas, in order to find a solution allowing compensation of this shift.

Two deformation phenomena of the semi-conducting material induce a variation in the positions (and optionally the dimensions) of the active and inactive areas 51, 52 between the rear 54 and front 53 faces of the layer 50 of nitride of a group 13 element:

a so-called "geometrical" deformation phenomenon occurring during the making of a semi-conducting material of the bimetal type (i.e. a layer of nitride of a group 13 element not separated from the substrate), this geometrical deformation phenomenon is due to the radius of curvature of the substrate (and more specifically of the growth face of said substrate) and induces a variation in the position of the active and inactive areas between the sensor of the semi-conducting material and the edge of the latter;

a so-called "thermal" deformation phenomenon occurring upon making a semi-conducting material of the self-supported type of a layer of nitride of a group 13 element (i.e. a layer of nitride of a group 13 element separated from the substrate), this thermal deformation phenomenon is due to the differences in thermal expansion coefficients between the layers of different compositions during the manufacturing of the semi-conducting material, for example, the expansion coefficient of a sapphire substrate is different from the expansion coefficient of a layer of AlN which itself is different from the expansion coefficient of a GaN layer.

2. Compensation of the Shift

In order to compensate for the variations in position of the active and inactive areas, various solutions were contemplated, mainly depending on the type of semi-conducting material (i.e. self-supported or a bimetal) which one wishes to manufacture.

However, regardless of the type of semi-conducting material manufactured, the compensation for the variations in position is based on taking into account a desired theoretical pattern pitch between two adjacent active areas on the front face of the layer of nitride of a group 13 element.

From this theoretical pattern pitch, the inventors propose calculation of a mask pitch different from the theoretical pattern pitch, this mask pitch corresponding to a distance between two adjacent apertures 21 of the protective mask used for the manufacturing of the semi-conducting material.

As this will be described in more detail subsequently, the estimation of the mask pitch from the theoretical pattern pitch may be determined accurately by taking into account the type of semi-conducting material which one wishes to manufacture, the thickness of the layer of nitride of a group 13 element, and more generally the various parameters applied for growing the layer of nitride of a group 13 element (nature of the layers of the semi-conducting material, radius of curvature of the growth face of the substrate, etc.).

2.1 Compensation of the Variations in Position Due to Geometrical Deformation

During the manufacturing of a semi-conducting material of the bimetal type, the change in position of the active and inactive areas is mainly due to the radius of curvature of the substrate, and more specifically to the radius of curvature of its growth face (i.e. the face on which the layer of nitride of a group 13 element is epitaxied).

Figure 3:
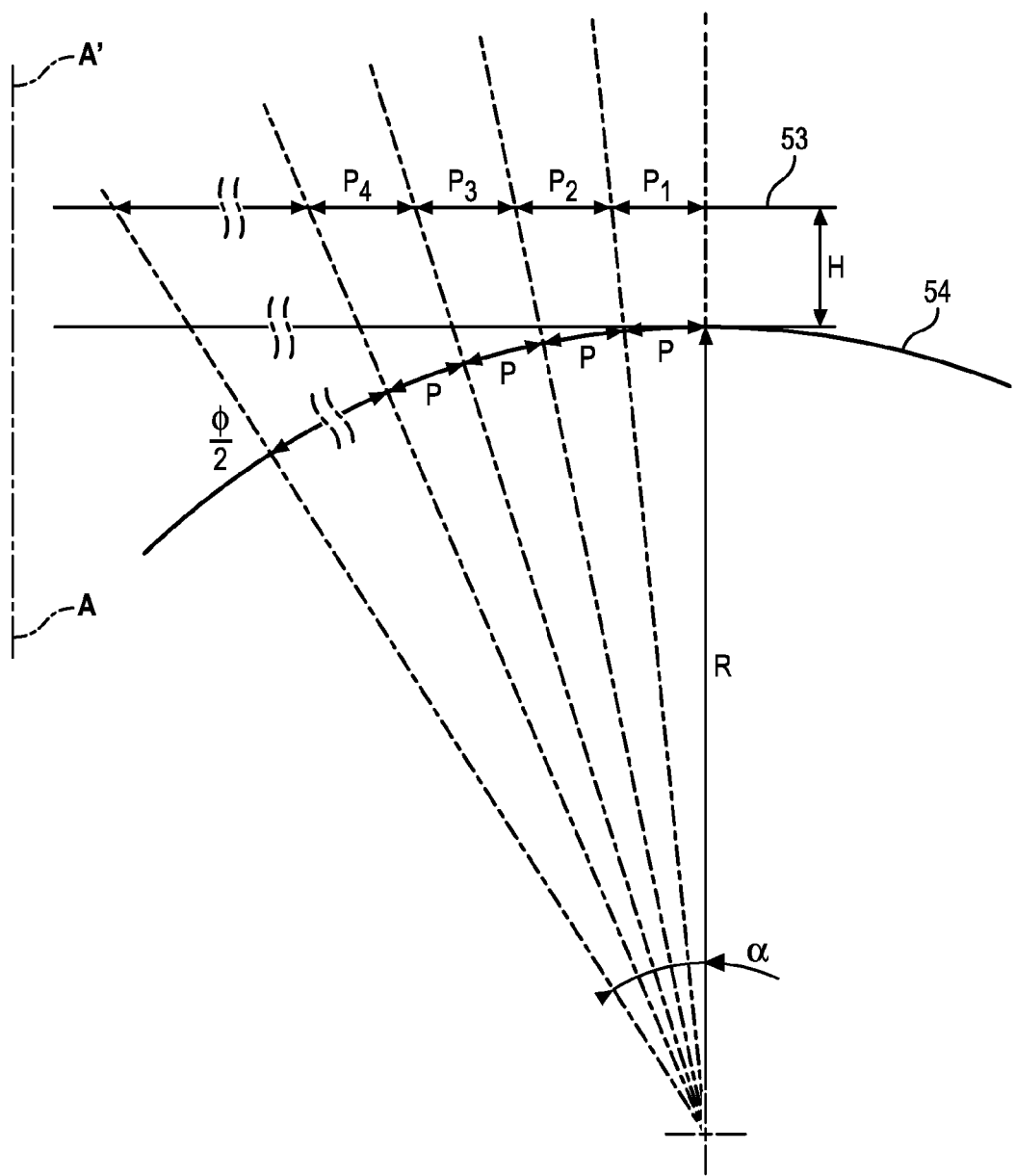
FIG. 3 illustrates the shift in the patterns in the case of deformations of geometrical origin on the layer of nitride of a group 13 element.

As illustrated in FIG. 3, for a constant mask pitch P on the protective mask, different actual pattern patches P1, P2, P3, P4 are obtained after growth of the layer of nitride of a group 13 element, on the front face 53 of the layer of nitride of a group 13 element. Thus, on the front face of the layer of nitride of a group 13 element, the actual pattern pitches of the active areas vary between the centre and the periphery of the semi-conducting material depending on the radius of curvature (on the growth face) of the initial substrate.

Notably, the maximum deviation between the mask pitch P and the actual pattern pitches P1, P2, P3, P4 obtained on the front face of the layer of nitride of a group 13 element is given by the following formula:

$$Delta_{max} = \tan\left(\frac{\phi}{2R}\right)(R \pm H) - \frac{\phi}{2} \qquad (1)$$

Wherein:
R corresponds to the physical radius of curvature of the growth face of the initial substrate,
Φ corresponds to the diameter of the initial substrate perpendicularly to the growth direction A-A',
H corresponds to the distance between the initial substrate and the front face of the layer of nitride of a group 13 element,
$Delta_{max}$ corresponds to the largest shift in position of a pattern with respect to its rated position (without any deformation effect induced by the curvature of the semi-conducting material) by assuming proper alignment with the centre of the substrate (maximum shift of the pitch on the reference layer),
the sign "±" depends on the shape of the rear face of the substrate as seen from the rear of said substrate:
concave: +H (like in FIG. 3);
convex: −H.

This thereby calculated maximum value is then applied as a pitch shift value to the mask in order to obtain a regular pitch on the final layer of semi-conductor corresponding to the required theoretical pitch.

In order to overcome this variation in position, various solutions may be contemplated depending on the stresses associated with the making of the electronic components in the active areas of the layer of nitride of a group 13 element, and notably depending on the maximum tolerated error margin between the theoretical pattern patch and the actually obtained pattern pitch on the front face of the layer of nitride of a group 13 element.

2.1.1 Case of a Tolerated Zero Error Margin

When it is desired to obtain a layer of nitride of a group 13 element on which the active areas are separated by an actual pattern pitch strictly equal to the theoretical pattern patch, then a solution may consist in varying the mask pitch between the centre and the periphery of the initial substrate.

The various mask pitches may be estimated by using formula (1) depending:
on the desired theoretical pitch for the active areas,
on the desired distance H between the front face of the initial substrate and the front face of the layer of nitride of a group 13 element,
on the radius of curvature R and on the diameter Φ of the initial substrate perpendicularly to the growth direction A-A'.

By producing mask pitches with variable dimensions at the initial substrate, constant actual pattern pitches are obtained on the front face of the layer of nitride of a group 13 element.

It is thus possible to compensate for the variations in position of the active areas at the front face of the layer of nitride of a group 13 element.

2.1.2 Case of a Non-zero Tolerated Error Margin

When a non-zero error margin is tolerated between the theoretical pitch and active areas, it is possible to apply the technique described in point 2.1.1.

Alternatively, for example when one wishes to form a thick layer of nitride of a group 13 element in which various slices are subsequently cut out for producing electronic components, it is possible:

to calculate a median thickness of the layer of nitride of a group 13 element at which the error between the actual pattern pitches of the active areas and the theoretical pitch is minimum,
to estimate the number of slices which may be cut out above and below this median thickness and in which the actual pattern pitches of the active areas on the front faces of the slices satisfy the tolerated error margin.

2.2 Compensation for the Variations in Position Due to Thermal Deformation

As described earlier, the variations in position may be due to geometrical deformations.

In the case of the manufacturing of a self-supported semi-conducting material, the effects associated with geometrical deformations:
are negligible because of the separation, or
may be made negligible by using an initial substrate having a radius of small curvature (R>5 meters) and by forming a layer of nitride of a group 13 element with a small thickness (of the order of one millimeter).

The variation of the actual pattern pitches of the active areas is in this case mainly due to thermal deformations.

Figure 4:
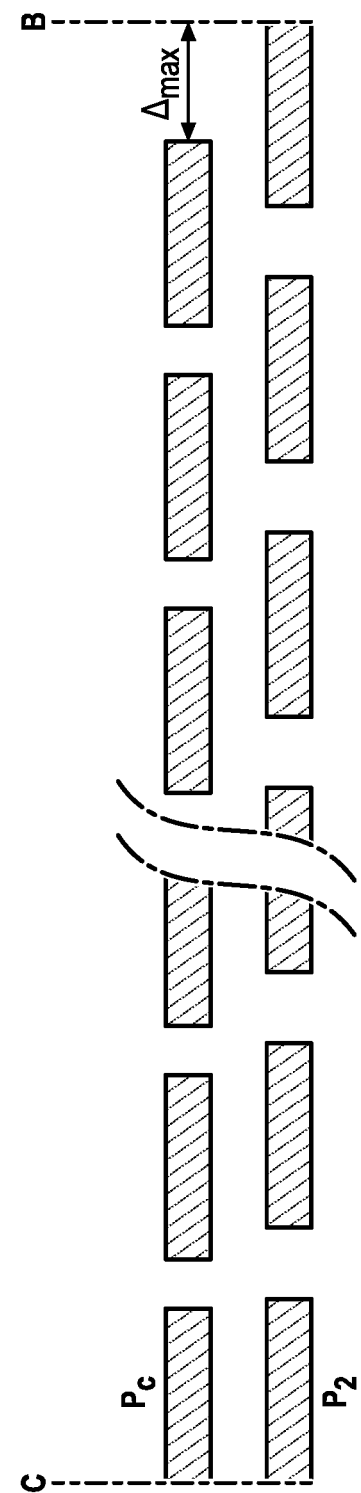
FIG. 4 illustrates the shift in the patterns in the case of deformations of thermal origin.

As illustrated in FIG. 4, for a mask pitch Pc on the protective mask, an actual pattern pitch P2 is obtained after growing the layer of nitride of a group 13 element, different on the front face of the layer of nitride of a group 13 element.

In this figure, the centre C of the nitride layer is located on the left; the periphery edge B is as for it located on the right of the figure.

Notably, the maximum separation between the mask pitch P and the actual pattern pitches P1, P2, P3, P4 obtained on the front face of the layer of nitride of a group 13 element is given by the following formula:

$$Delta\text{Max} = \Delta_M = \frac{(p_2 - p_c)}{p_c}\frac{\Phi}{2} \qquad (2)$$

In order to compensate for these variations, it is possible to calculate a mask pitch from the desired theoretical pitch for the active areas by applying the following formula:

$$p_0 = p_c \times \left(\frac{2\Delta_M}{\Phi} + 1\right) \times \frac{1}{1 + (TC - TA) \times (CTE^{substrate} - CTE^{material})} \qquad (3)$$

wherein:
$P_0$ is the mask pitch,
$P_c$ is the theoretical pattern pitch,
$\Delta_m$ is the tolerance value,
Φ is the diameter of the initial substrate perpendicularly to the growth direction A-A',
TC is the growth temperature of the material,
TA is the room temperature,
$CTE^{substrate}$ is the thermal expansion coefficient of the initial substrate,
$CTE^{material}$ is the thermal expansion coefficient of the layer of nitride of a group 13 element.

Electronic components may then be made in the active areas of the layer of nitride of a group 13 element.

2. Exemplary Embodiment

Figure 5:
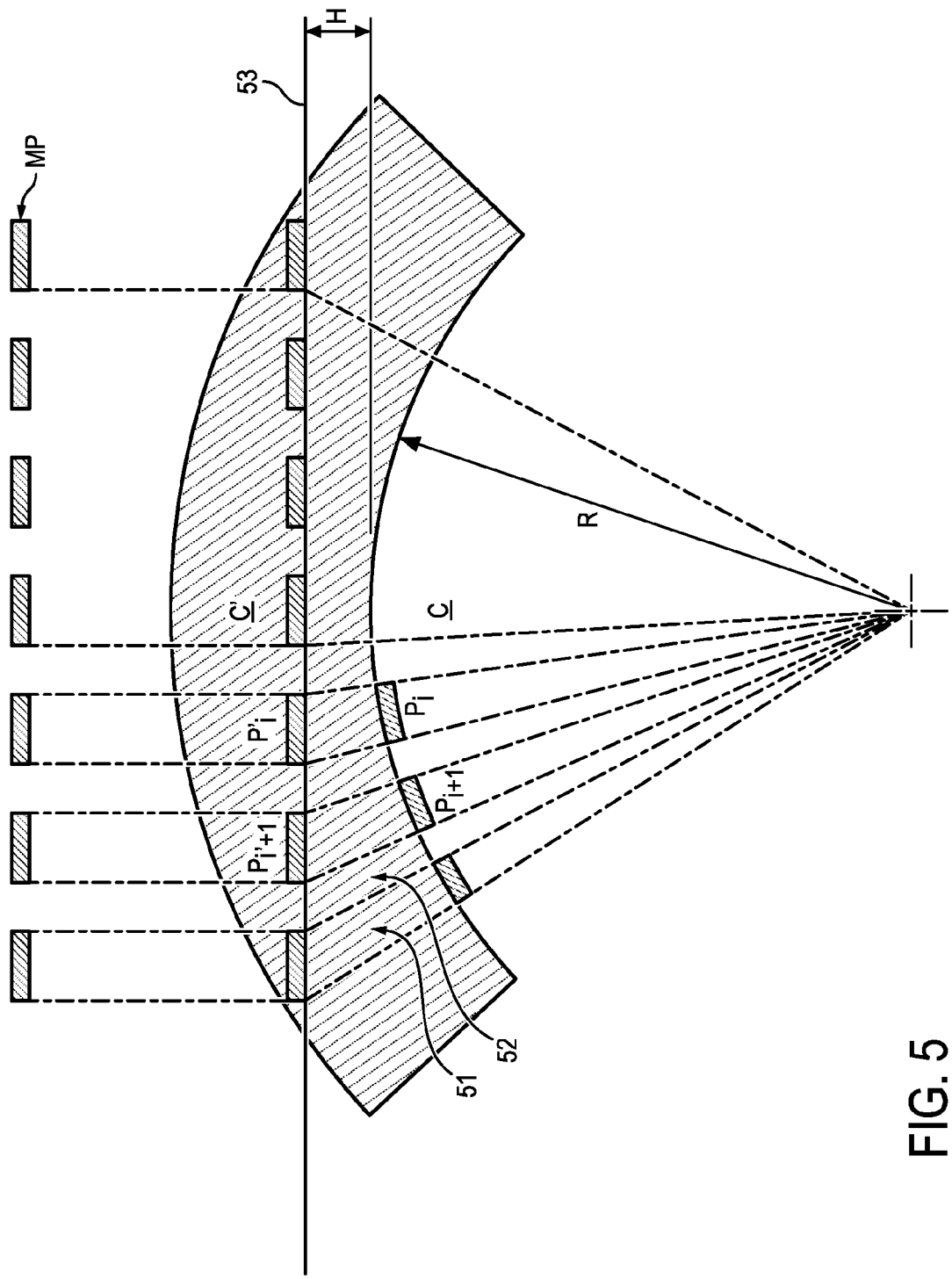
FIG. 5 illustrates an exemplary embodiment of the invention.

As illustrated in FIG. 5, in a possible embodiment, the protective mask PM used during the formation of the substrate has a protective mask which is different from the theoretical pattern pitch provided beforehand, Notably, the actual mask pitch is calculated beforehand from a theoretical mask pitch as expected from the user, this theoretical mask pitch corresponds to a desired distance by the user between two adjacent active areas.

Depending on whether the deformations are of geometrical or thermal origins, the calculation of the actual pitch p0 is performed for example by applying the calculations as proposed in formulae (0) and/or (3).

Of course, the shapes and dimensions of the active and inactive areas may vary depending on the targeted application.

This method gives the possibility of obtaining a semi-conducting material including a layer of nitride of a group 13 element including on its front face 53 active areas 52 and inactive areas 51, the active areas 52 being spaced apart by an actual pattern pitch equal to a theoretical pattern pitch to within a tolerance value.

One skilled in the art will have understood that many modifications may be brought to the invention described above without materially departing from the novel teachings shown here.

It is therefore quite obvious that the examples which have just been given are only particular illustrations and by no means limiting.

The invention claimed is:

1. A method for manufacturing a semi-conducting material including a layer of a nitride of a group 13 element comprising active areas for manufacturing electronic components, and inactive areas, the active and inactive areas extending on a front face of the layer of nitride of a group 13 element, the concentration of crystal defects in the active areas being less than the concentration of defects in the inactive areas, the method comprising the steps consisting of:
using a protective mask for forming on an initial substrate:
first regions for growing active areas and
second regions for growing inactive areas,
the protective mask comprising a plurality of apertures each defining an active area pattern on the initial substrate, and
growing the layer of the nitride of a group 13 element comprising the active and inactive areas on the first and second regions,
the semi-conducting material comprising growth conditions such that at least one of a geometrical deformation and a thermal deformation of said semi-conducting material occurs during growth of the layer of the nitride of a group 13 element,
wherein the protective mask used during the formation of the substrate has a protective mask pitch which is different from a theoretical pattern pitch provided beforehand,
said theoretical pattern pitch provided beforehand corresponding to a desired distance between two adjacent active area patterns on the front face of the layer of nitride of a group 13 element,
the protective mask pitch compensating for shifts in the active area patterns due to the growth conditions of the semi-conducting material,
the obtained active area patterns being spaced apart by an actual pattern pitch corresponding to the theoretical pattern pitch to within an error margin.

2. The method according to claim 1, wherein the protective mask pitch is estimated by calculation from the theoretical pattern pitch and from parameters related to the growth conditions of the semi-conducting material.

3. The method according to claim 2, wherein the calculation of the protective mask pitch further takes into account a tolerance value ("DeltaMax") corresponding to the maximum tolerated error between the theoretical pattern pitch and the actual pattern pitch.

4. The method according to claim 1, wherein the calculation parameters related to the growth conditions of the semi-conducting material include the following parameters:
a temperature variation between an initial temperature, such as a room temperature, and a temperature for growing the layer of nitride of a group 13 element,
the thermal expansion coefficient of the initial substrate and
the thermal expansion coefficient of the layer of nitride of a group 13 element.

5. The method according to claim 1, wherein the step for calculating the mask pitch corresponds to the resolution of the following equation:

$$p_0 = p_c \times \left(\frac{2\Delta_M}{\Phi} + 1\right) \times \frac{1}{1 + (TC - TA) \times (CTE^{substrate} - CTE^{material})}$$

wherein:
$p_0$ is the mask pitch,
$p_c$ is the theoretical pattern pitch,
$\Delta_m$ is the tolerance value,
$\Phi$ is the diameter of the initial substrate perpendicularly to the growth direction A-A',
TC is the growth temperature of the material,
TA is the room temperature,
$CTE^{substrate}$ is the thermal expansion coefficient of the initial substrate,
$CTE^{Ematerial}$ is the thermal expansion coefficient of the layer of nitride of a group 13 element.

6. The method according to claim 1, wherein the protective mask pitch is estimated by calculation from the radius of curvature of the initial substrate deformed at the end of the growth of the semi-conducting material.

7. The method according to claim 6, wherein, during the calculation step, a plurality of adapted mask pitches is estimated to space apart active area patterns by a constant actual pattern pitch on the front face of the layer of nitride of a group 13 element.

8. The method according to claim 6, wherein the step for calculating the mask pitch corresponds to the resolution of the following equation:

$$p_0 = Pc - \tan\left(\frac{\phi}{2R}\right)(R \pm H) - \frac{\phi}{2}$$

wherein:
$\Phi$ is the diameter of the initial substrate, $p_0$ is the mask pitch,
$p_c$ is the theoretical pattern pitch,
R is the radius of curvature of a growth face of the initial substrate,
H is the distance between the front face and the rear face of the layer of nitride of a group 13 element.

9. The method according to claim 2, wherein the protective mask pitch is estimated by calculation from the radius of curvature of the initial substrate deformed at the end of the growth of the semi-conducting material further comprising a step for calculating first and second heights in the layer of nitride of a group 13 element, said first and second heights defining a thickness of the layer of nitride of a group 13 element in which the deviation between the theoretical pattern pitch and the actual pattern pitch is less than the tolerance value.

10. The method according to claim 9, further comprising the formation of slices in the thickness of the layer of nitride of a group 13 element between the calculated first and second heights.

11. The method according to claim 1, and further takes into account a tolerance value ("DeltaMax") corresponding to the maximum tolerated error between the theoretical pattern pitch and the actual pattern pitch, wherein the method comprises a step for calculating the positions of the apertures of the protective mask on the initial substrate, the distance between two adjacent apertures being adapted to compensate for the shifts in active area patterns on the whole of the surface of the front face of the layer of nitride of a group 13 element.

* * * * *